(12) United States Patent
Curtis et al.

(10) Patent No.: US 6,694,029 B2
(45) Date of Patent: Feb. 17, 2004

(54) UNOBTRUSIVE REMOVAL OF PERIODIC NOISE

(75) Inventors: Dale Vernon Curtis, Scottsdale, AZ (US); Charles Clifford Adams, Gilbert, AZ (US)

(73) Assignee: Fender Musical Instruments Corporation, Scottsdale, AZ (US)

( * ) Notice: Subject to any disclaimer, the term of this patent is extended or adjusted under 35 U.S.C. 154(b) by 0 days.

(21) Appl. No.: 09/952,942

(22) Filed: Sep. 14, 2001

(65) Prior Publication Data

US 2003/0053640 A1 Mar. 20, 2003

(51) Int. Cl.⁷ .............................................. H04B 15/00
(52) U.S. Cl. ...................... 381/94.1; 381/94.3
(58) Field of Search .............................. 381/71.1, 94.1, 381/94.5, 94.7, 104, 106, 105, 107; 455/222

(56) References Cited

U.S. PATENT DOCUMENTS

| 3,989,897 | A | | 11/1976 | Carver |
| 4,733,193 | A | | 3/1988 | Klokocka |
| 5,260,974 | A | * | 11/1993 | Johnson et al. .............. 455/222 |
| 5,377,272 | A | * | 12/1994 | Albean ........................ 381/106 |
| 5,523,526 | A | | 6/1996 | Shattil |

* cited by examiner

Primary Examiner—Minsun Oh Harvey
(74) Attorney, Agent, or Firm—Paul F. Wille

(57) ABSTRACT

An input signal is applied to a notch filter having a transfer function that is the inverse of the expected noise signal. The filtered signal is coupled to a first amplifier and the input signal is coupled to a second amplifier. The outputs of the amplifiers are summed. The gains of the amplifiers are oppositely adjusted in response to the magnitude of the input signal. At low amplitude, the filtered signal is amplified more than the unfiltered signal. At high amplitude, the unfiltered signal is amplified more than the filtered signal.

9 Claims, 1 Drawing Sheet

UNOBTRUSIVE REMOVAL OF PERIODIC NOISE

BACKGROUND OF THE INVENTION

This invention relates generally to processing audio signals and, in particular, to removing an undesirable periodic noise component from an audio signal without perceptibly affecting the remaining signal.

It is common in musical instruments, particularly with electrically amplified guitars, to sense string vibration with a magnetic pickup. Typically, the sensor or pickup includes of a series of magnetic cylinders located concentrically within a wire winding. As the metallic strings of the guitar vibrate close to the magnetic cylinders, a varying electric field is generated around the magnetic cylinders. This varying electric field causes a current to flow through the wire winding that is proportional to the displacement of the strings from the magnetic cylinders. The current is passed to an amplifier system in which the signal is amplified, processed, and ultimately converted back into an acoustical signal by a loudspeaker or a headphone.

The purpose of the wire winding is to detect movement of the strings. However, the winding is sensitive to electromagnetic signals from any source, not just the string/magnet system. The most common sources of electromagnetic signals include power conversion circuitry, such as dimmers in lighting systems, transformers, cathode ray tubes (CRTs) as used in home computer systems and television sets, and digital clock signals used in appliances containing a microcontroller. This electromagnetic interference (EMI) imposes an undesirable "hum" in the musical instrument signal, wherein each source produces a characteristic signal.

Various methods have been tried for reducing the effect of EMI on magnetic pickups. For example, a "humbucker" pickup utilizes two pickups as described above in close proximity to one another, but having oppositely wound wire windings. If the EMI present within the two windings is equal, the opposed windings will cause the currents induced in the pickups to have equal amplitudes but opposite polarity. Summing the induced currents cancels the noise signal. Hum cancellation by this pickup is excellent in most conditions but the subjective qualities of the string signal are changed significantly relative to a single coil pickup.

Another device that has been used to reduce hum is the noise gate; e.g see U.S. Pat. No. 3,989,897 (Carver). The noise gate is like a squelch circuit wherein a signal from the pickup is reduced when its energy level falls below a specified threshold. If this threshold is set correctly, the undesirable EMI induced signal is reduced or eliminated in the absence of a signal from the strings. However, this method can result in reduction or elimination of the signal from the strings when its energy level is low. This effect can be more annoying than the noise signal itself.

Notch filters have also been used to try to eliminate hum. A notch filter attenuates a signal in a very narrow band of frequencies. Digital implementations of notch filters make it relatively easy to provide a plurality of notches, at the fundamental frequency of the hum and its harmonics, whereby the hum can be reduced or eliminated completely.

As noted above, the various sources of EMI each have a characteristic signal. Depending on the source, many notches may be required in the notch filter to reduce the hum signal satisfactorily. This is especially the case for impulse noise, such as emitted by CRTs. Impulse noise contains significant high frequency energy. To be effective on these signals, a notch filter requires either extensive hardware or a powerful digital signal processor (DSP), making the implementation expensive and complex. Also, a notch filter changes the subjective quality of the signal of interest by changing its tonal characteristics and causing "dropouts" for notes, or their harmonics, at or near the center frequency of a notch.

U.S. Pat. No. 4,733,193 (Klokocka) discloses a system in which an input signal is divided between two channels, one of which goes directly to a subtraction circuit. The other channel includes a delay loop for enhancing the hum signal, which is then coupled as another input to the subtraction circuit. The gain of the loop and the gain of the channel vary inversely to try to cancel the hum.

Several proposed methods for eliminating periodic noise from an audio signal require complex digital and analog circuitry that is expensive to implement.

These prior art designs tend to be ineffective in eliminating a periodic noise signal, excessively disruptive to the signal of interest, exceedingly complex and expensive, or a combination of these faults.

In view of the foregoing, it is therefore an object of the invention to provide a technique for eliminating a periodic noise with minimal disruption of the signal of interest.

Another object of the invention is to provide a technique that can be implemented in hardware or software at relatively low cost.

A further object of the invention is to provide a technique for eliminating periodic noise from a signal wherein the technique is easily adapted to any one source of noise or to several sources of noise.

SUMMARY OF THE INVENTION

The foregoing objects are achieved by this invention wherein an input signal is applied to a notch filter having a transfer function that is the inverse of the expected noise signal. The filtered signal is coupled to a first amplifier and the input signal is coupled to a second amplifier. The outputs of the amplifiers are summed. The gains of the amplifiers are oppositely adjusted in response to the magnitude of the input signal. At low amplitude, the filtered signal is amplified more than the unfiltered signal. At high amplitude, the unfiltered signal is amplified more than the filtered signal.

BRIEF DESCRIPTION OF THE DRAWINGS

A more complete understanding of the invention can be obtained by considering the following detailed description in conjunction with the accompanying drawings, in which.

DETAILED DESCRIPTION OF THE INVENTION

Figure 1:
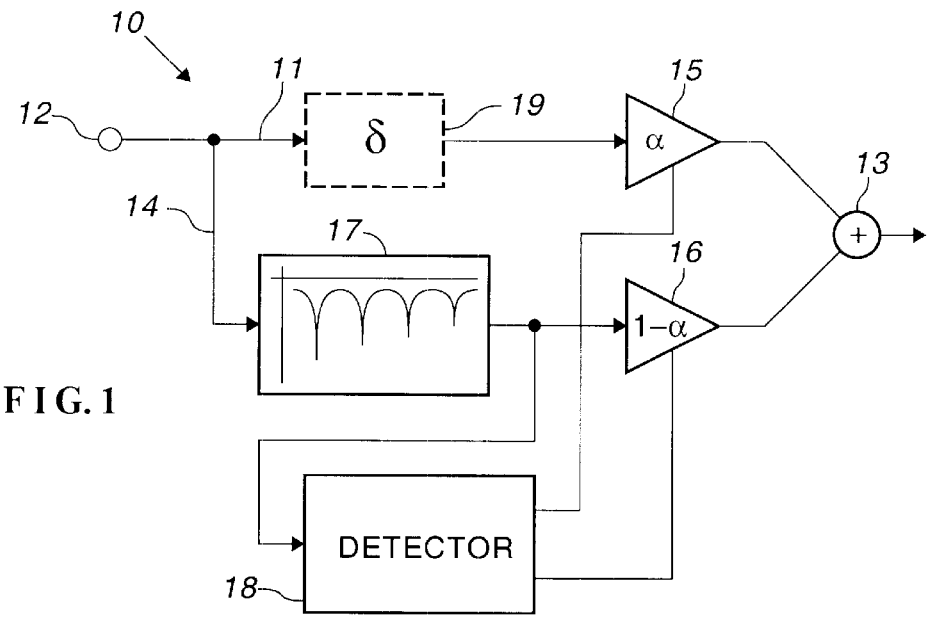
FIG. 1 is a block diagram of a noise reduction circuit constructed in accordance with a preferred embodiment of the invention.

FIG. 1 is a block diagram of a preferred embodiment of a circuit constructed in accordance with the invention for eliminating periodic noise. The circuit includes two channels having inversely adjustable gains. One channel includes a notch filter having a center frequency set to the frequency of the periodic noise signal. When the input signal is at low amplitude, the noise is most noticeable. The circuit increases the gain of the filtered signal more than the gain of the unfiltered signal, thereby reducing the noise. When the input signal has a high amplitude, the noise is unnoticeable. The circuit increases the gain of the unfiltered signal more than the gain of the unfiltered signal, thereby eliminating any effect of the circuit on the signal.

In FIG. 1, circuit 10 includes first channel 11, extending from input 12 to summation circuit 13, and second channel 14, also extending from input 12 to summation circuit 13 in parallel with channel 11. Channel 11 includes variable gain amplifier 15 and channel 12 includes variable gain amplifier 16. For sake of illustration, amplifiers 15 and 16 are assumed to have a maximum gain of unity or one. As indicated in FIG. 1, the gains of the amplifiers vary inversely; that is, if the gain of amplifier 15 is $\alpha$, then the gain of amplifier 16 is $(1-\alpha)$.

Channel 14 also includes filter 17, which is preferably a notch filter and preferably includes a plurality of notches that match the frequency spectrum of a periodic noise signal. That is, filter 17 preferably has a transfer function that is the inverse of the spectrum of the noise signal. For example, for power line hum, filter 17 prefereably has a notch at 60 Hz, 120 Hz, 180 Hz and so on, corresponding to the spectrum of the hum caused by line operated power supplies and the like.

The output from filter 17 is coupled to amplifier 16 and to detector 18. Detector 18 is described in more detail in connection with FIGS. 2 and 3. In general, detector 18 determines the energy content of the input signal and produces two, inversely related, control signals in response to the energy content of the input signal.

Channel 11 optionally includes delay 19, which is preferably implemented as a digital filter, to minimize phase distortions in the output signal from circuit 10 Filter 17 is preferably implemented as an infinite impulse response (IIR) filter, which typically introduces a delay of a few milliseconds into channel 12. Delay 19 compensates for the delay of filter 17 by introducing a delay into channel 11.

Figure 2:
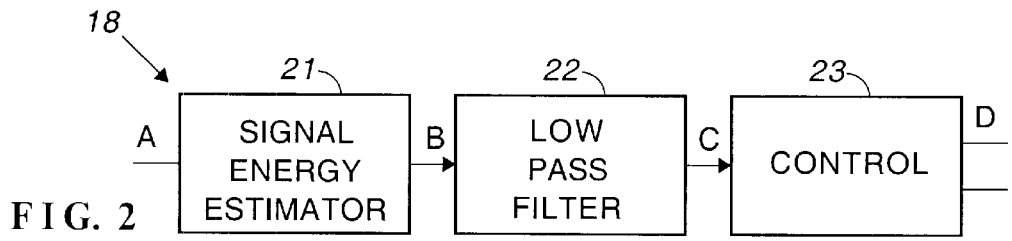
FIG. 2 is a block diagram of a detector that can be used in the circuit illustrated in FIG. 1.
Figure 3:
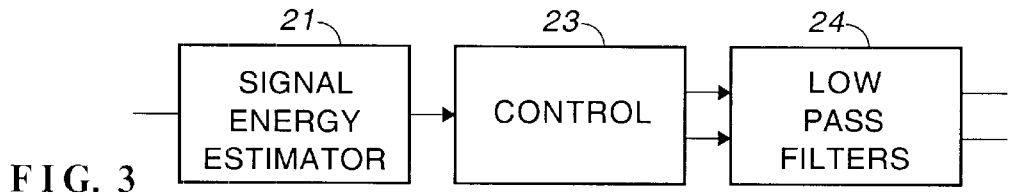
FIG. 3 is a block diagram of an alternative embodiment of a detector that can be used in the circuit illustrated in FIG. 1.

In FIG. 2, detector 18 includes signal energy estimator circuit 21, low pass filter 22 and control circuit 23. As indicated in FIG. 3, the low pass filter and the control signal generator can be interchanged. As indicated in FIG. 2, the signals at each point in the circuit are labeled with a letter; A, B, C, D. These letters are also used in the equations that follow.

Signal energy estimator 21 includes circuitry, known in the art in digital multimeters, for example, for calculating the energy of an input signal. Functionally, estimator 21 can be as simple or as complex as desired, as can filter 22 and control circuit 23. The choice is dictated by cost. At the extreme low cost end of the spectrum, one could use a rectifier and capacitor for elements 21 and 22 and an amplifier with complementary outputs for control circuit 23, although circuit 10 would not work as well as it could. A digital implementation is preferred.

Estimator 21 is preferably implemented as a full wave rectifier coupled to a first order infinite impulse response, low pass filter having a cutoff frequency of approximately 50 Hz. Sample n is calculated according to Equation (1).

$$B[n] = k \cdot |A[n]| + l \cdot B[n-1] \quad (1)$$

wherein $$k = 1 - e^{\frac{-2\pi f_c}{f_s}}$$

$$l = 1 - k$$

and $f_c$ is the cut-off frequency of the filter, e.g. 50 Hz, and $f_s$ is the sampling rate, e.g. 44.1 kHz.

Low pass filter 22 is preferably implemented as another first order infinite impulse response, low pass filter. Sample n is calculated according to Equation (2).

$$C[n] = k' \cdot |B[n]| + l' \cdot C[n-1] \quad (2)$$

In equation (2), k and l have different values from those used in equation (1) and, therefore, are primed. The cut-off frequency of filter 22 is approximately 10 Hz.

The output from low pass filter 22 is converted into a control signal for controlling the gain of amplifiers 15 and 16. The control signal is calculated according to Equation (3).

$$0 \leq D = \frac{T_H - C}{T_H - T_L} \leq 1.0 \quad (3)$$

In Equation (3), $T_H$ is an upper, user defined, threshold and $T_L$ is a lower, user defined threshold. The thresholds are set by a user using a rotary encoder, for example.

Referring to FIG. 1, the output from summation circuit 13 can be the unaltered input signal from input 12, the filtered output signal from filter 17, or a mixture of the two signals. Specifically, when the input signal is low, $\alpha=0$, $(1-\alpha)=1$, and the output signal is the signal from filter 17. When the input signal is high, $\alpha=1$, $(1-\alpha)=0$, and the output signal is the unfiltered input signal. When the input signal is between the thresholds, the gains of the amplifiers are linearly varied between 0 (zero) and 1 (one) according to the energy level, and the output signal is a mixture of the filtered and unfiltered input signal.

An advantage of the invention is that, when the input signal approaches zero, any effect of filter 17 on the sound quality of the input signal is least noticeable. The hum component is reduced significantly by the filter 17. At high input signal levels, filter 17 is effectively removed from the signal path and the hum component is masked by the signal of interest and is least noticeable to a listener.

Still referring to FIG. 1, filter 17, in a preferred embodiment of the invention, was a multiband notch filter. The filter design was such that the frequency response had narrow stop bands at the primary noise frequencies of 60 Hz, 120 Hz, 180 Hz, and so on. Specifically, the filter had notches at 60 Hz and all harmonic frequencies of 60 Hz up to 1800 Hz. This was accomplished by means of a cascaded bank of thirty second-order IIR band reject filters, resulting in a 60th order multiband reject filter. Bank M of the IIR filter is defined by Equation 4.

$$y_M[n] = b_{M,0} \cdot y_{M-1}[n] + \quad (4)$$

$$b_{M,1} \cdot y_{M-1}[n-1] +$$

$$b_{M,2} \cdot y_{M-1}[n-2] -$$

$$a_{M,1} \cdot y_M[n-1] -$$

-continued $$\alpha_{M,2} \cdot y_M[n-2]$$

The coefficients are defined as follows.

$$b_{M,0} = 1.0$$

$$b_{M,1} = -2.0 \cdot Z_M \cdot \cos\left(\frac{2 \cdot \pi \cdot M \cdot 60}{44100}\right)$$

$$b_{M,2} = Z_M^2 \qquad P_M = (0.9998)^M$$

$$\alpha_{M,1} = -2.0 \cdot P_M \cdot \cos\left(\frac{2 \cdot \pi \cdot M \cdot 60}{44100}\right) \quad Z_M = 1.0 - \left(\frac{1.0 - P_M}{100}\right)$$

$$\alpha_{M,2} = P_M^2$$

The input to the first filter bank is coupled to input 12 and the output from the last filter bank is coupled to amplifier 16.

Figure 4:
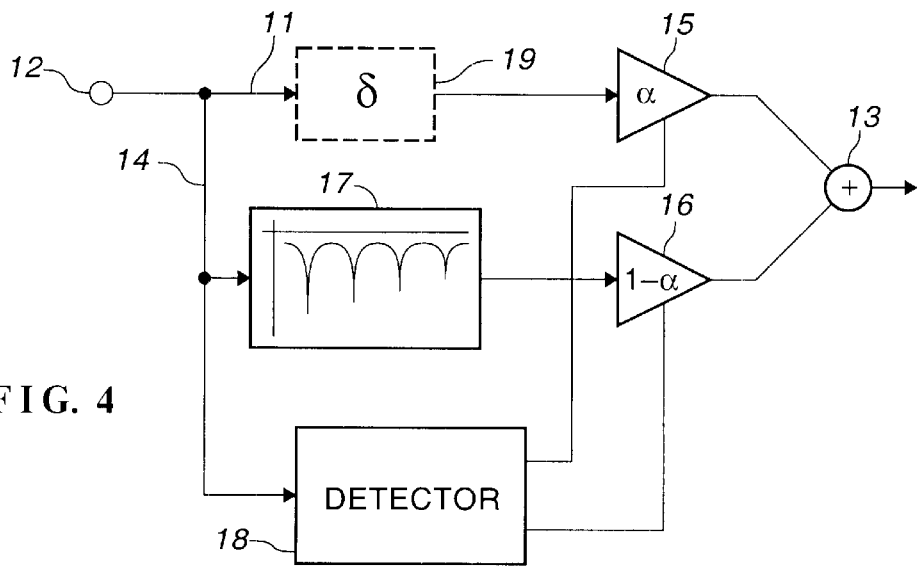
FIG. 4 is a block diagram of a noise reduction circuit constructed in accordance with an alternative embodiment of the invention.

FIG. 4 is a block diagram of noise filter constructed in accordance with an alternative embodiment of the invention. This embodiment is the same as that shown in FIG. 1, except that the input to detector 18 is coupled to input 12 instead of filter 17. As a result, the noise signal contributes to the energy spectrum being analyzed to determine which channel to favor. In this embodiment, the signal energy into detector 18 is equal to or greater than the signal energy into detector 18 in FIG. 1 for the same, noise bearing, input signal. The increased energy causes the circuit of FIG. 4 to slightly favor channel 11. In other words, the circuit errs on the side of fidelity rather than noise elimination, which is fine as long as the periodic noise is not too loud.

The invention thus provides a technique for eliminating a periodic noise with minimal disruption of the signal of interest. The technique can be implemented in hardware or software at relatively low cost and can be adapted to any source of periodic noise or even plural sources of periodic noise.

Having thus described the invention, it will be apparent to those of skill in the art that various modifications can be made within the scope of the invention. For example, the invention can be implemented in analog form. The particular equation used for energy estimation is preferred and not the only one that will work. One can provide an embodiment like FIG. 4 except that the detector includes a filter for removing only the fundamental of a periodic noise signal. Whether summation circuit 13 actually adds or subtracts depends upon the polarities of the signals applied to it. Instead of measuring energy, one could look simply at the average amplitude of the input signal to determine which channel to use. The cut-off frequencies of the low pass filters depends, in part, on the fundamental frequency of the periodic noise and, in part, on circuit stability. The cut-off frequencies are preferably below the fundamental frequency of the periodic noise.

What is claimed as the invention is:

1. Apparatus for unobtrusively removing a periodic noise signal from an input signal, said apparatus comprising:
    an input;
    a first channel coupled to said input and having an adjustable gain;
    a second channel having an adjustable gain coupled to said input;
    a detector coupled to said input for producing a control signal indicative of the energy of said input signal; said control signal causing the gain of the first channel and the gain of the second channel to vary inversely; and
    a notch filter in said second channel, said notch filter having at least one notch substantially at the fundamental frequency of said noise signal.

2. The apparatus as set forth in claim 1 wherein said control signal varies the gain of the first channel in accordance with the energy of the input signal and varies the gain of the second varies the gain of the second channel inversely with the energy of the input signal.

3. The apparatus as set forth in claim 1 wherein said detector produces a control signal indicative of the average energy of the input signal.

4. The apparatus as set forth in claim 1 wherein said detector includes a first threshold detector and a second threshold detector.

5. The apparatus as set forth in claim 4 wherein said control signal sets the first channel to maximum gain and the second channel to minimum gain when the first threshold is exceeded and sets the first channel to minimum gain and the second channel to maximum gain when the second threshold is not exceeded.

6. The apparatus as set forth in claim 1 wherein said notch filter includes additional notches substantially at harmonics of the fundamental of said noise signal.

7. The apparatus as set forth in claim 1 wherein said detector is coupled to said input by said notch filter.

8. A method of unobtrusively removing a periodic noise signal from an input signal, said method comprising the steps of:
    (a) providing a first channel for the input signal;
    (b) providing a second channel for the input signal, wherein the second channel includes a notch filter having at least one notch substantially at the fundamental frequency of said noise signal;
    (c) coupling the input signal to both channels; and
        (i) passing the input signal through the first channel at high signal levels; and
            passing the input signal through the second channel at low signal levels; or
        (ii) passing the input signal through both channels at intermediate signal levels; wherein the first channel has an adjustable gain and the second channel has an adjustable gain and said method further includes the step of:
            varying the gain of the first channel inversely to the gain of the second channel.

9. A method of unobtrusively removing a periodic noise signal from an input signal, said method comprising the steps of:
    (a) providing a first channel for the input signal;
    (b) providing a second channel for the input signal, wherein the second channel includes a notch filter having at least one notch substantially at the fundamental frequency of said noise signal;
    (c) filtering the fundamental and harmonics of the noise signal from the second channel;
    (d) coupling the input signal to both channels; and
        (i) passing the input signal through the first channel at high signal levels; and
            passing the input signal through the second channel at low signal levels; or
        (ii) passing the input signal through both channels at intermediate signal levels; and varying the gain of the first channel in accordance with the magnitude of the input signal and varying the gain of the second channel inversely with the magnitude of the input signal.

* * * * *